United States Patent
Pahl

(10) Patent No.: US 11,234,082 B2
(45) Date of Patent: Jan. 25, 2022

(54) CARRIER SUBSTRATE FOR STRESS SENSITIVE DEVICE AND METHOD OF MANUFACTURE

(71) Applicant: TDK Corporation, Tokyo (JP)

(72) Inventor: Wolfgang Pahl, Munich (DE)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/495,807

(22) PCT Filed: Mar. 7, 2018

(86) PCT No.: PCT/EP2018/055661
§ 371 (c)(1),
(2) Date: Sep. 19, 2019

(87) PCT Pub. No.: WO2018/172081
PCT Pub. Date: Sep. 27, 2018

(65) Prior Publication Data
US 2020/0053484 A1   Feb. 13, 2020

(30) Foreign Application Priority Data
Mar. 21, 2017   (DE) .................... 10 2017 106 055.3

(51) Int. Cl.
*H04R 19/04* (2006.01)
*B81B 7/00* (2006.01)
(Continued)

(52) U.S. Cl.
CPC .......... *H04R 19/04* (2013.01); *B81B 7/0048* (2013.01); *B81C 1/00325* (2013.01);
(Continued)

(58) Field of Classification Search
CPC .... H04R 19/04; H04R 2201/003; H04R 7/16; H04R 19/005; B81B 7/0048;
(Continued)

(56) References Cited

U.S. PATENT DOCUMENTS 5,550,325 A * 8/1996 Matsuda ............. H01L 23/5382
174/250
5,866,237 A * 2/1999 Angelopoulos ........ H05K 3/184
428/209
(Continued)

FOREIGN PATENT DOCUMENTS

DE          10239080 A1    3/2004
DE     102007023590 A1   11/2008
(Continued)

OTHER PUBLICATIONS

"Spheron WLCSP—Bump on I/O and Spheron WLCSP—Redistribution," Flip Chip International, downloaded from http://www.flipchip.com/services/bumping/bumping-designoptions/bumpheights-160um/spheron-wlcsp-bumpon-io-and-redistribution on Sep. 13, 2016, 1 page.

*Primary Examiner* — Matthew A Eason
*Assistant Examiner* — Kuassi A Ganmavo
(74) *Attorney, Agent, or Firm* — Slater Matsil, LLP

(57) ABSTRACT

A carrier substrate and a method for making a carrier substrate are disclosed. In an embodiment a carrier substrate includes a substrate body having a multilayer structure, electrical connection pads on a top surface of the substrate body, an organic cushion layer on the top surface of the substrate body, electrically conductive elongated parts arranged on top of the cushion layer, wherein each conductive elongated part is contacted to a respective electric connection pad and a solder pad located at an end of each elongated part distant from the respective connection pad.

14 Claims, 3 Drawing Sheets

(51) Int. Cl.

| | | |
|---|---|---|
| *B81C 1/00* | (2006.01) | |
| *H01L 23/00* | (2006.01) | |
| *H04R 19/00* | (2006.01) | |
| *B81B 3/00* | (2006.01) | |
| *H01L 23/053* | (2006.01) | |
| *H01L 33/48* | (2010.01) | |
| *B06B 1/02* | (2006.01) | |
| *H01L 23/02* | (2006.01) | |
| *H01L 21/52* | (2006.01) | |

(52) U.S. Cl.
CPC ........... *B06B 1/0292* (2013.01); *B81B 3/0072* (2013.01); *B81B 2201/0257* (2013.01); *H01L 21/52* (2013.01); *H01L 23/02* (2013.01); *H01L 23/053* (2013.01); *H01L 24/06* (2013.01); *H01L 33/486* (2013.01); *H04R 19/005* (2013.01); *H04R 2201/003* (2013.01)

(58) Field of Classification Search
CPC .......... B81B 2201/0257; B81B 3/0072; B81C 1/00325; H01L 24/06; H01L 23/053; H01L 23/02; H01L 33/486; H01L 21/52; B06B 1/0292
See application file for complete search history.

(56) References Cited

U.S. PATENT DOCUMENTS

| | | | | |
|---|---|---|---|---|
| 6,208,525 | B1 | 3/2001 | Imasu et al. | |
| 6,492,200 | B1* | 12/2002 | Park | H01L 23/3171 438/113 |
| 6,660,942 | B2* | 12/2003 | Horiuchi | H01L 23/3735 174/258 |
| 6,930,256 | B1* | 8/2005 | Huemoeller | H01L 21/4857 174/255 |
| 7,928,550 | B2* | 4/2011 | Wachtler | H01L 23/5387 257/686 |
| 9,691,636 | B2* | 6/2017 | Wu | H01L 21/4846 |
| 2002/0048828 | A1* | 4/2002 | Sakamoto | H01L 24/97 438/15 |
| 2002/0093107 | A1* | 7/2002 | Wu | H01L 24/11 257/780 |
| 2003/0214036 | A1* | 11/2003 | Sarihan | H01L 24/13 257/738 |
| 2004/0070075 | A1 | 4/2004 | Hedler et al. | |
| 2005/0249933 | A1* | 11/2005 | Yamane | H05K 3/4069 428/292.1 |
| 2005/0280112 | A1* | 12/2005 | Abbott | H01L 24/05 257/472 |
| 2005/0287789 | A1* | 12/2005 | Tunaboylu | G01R 31/2889 438/622 |
| 2006/0163725 | A1* | 7/2006 | Haba | H01L 23/49838 257/737 |
| 2006/0278999 | A1* | 12/2006 | Hsu | H05K 3/3473 257/778 |
| 2009/0029504 | A1* | 1/2009 | Paik | H01L 21/563 438/108 |
| 2009/0061175 | A1* | 3/2009 | Kim | H05K 3/108 428/209 |
| 2010/0116531 | A1* | 5/2010 | Maier | H01L 24/05 174/257 |
| 2010/0127371 | A1* | 5/2010 | Tschirbs | H01L 23/3735 257/684 |
| 2010/0127377 | A1* | 5/2010 | Bauer | H01L 24/14 257/690 |
| 2011/0030999 | A1* | 2/2011 | Lee | H05K 3/386 174/255 |
| 2013/0247977 | A1* | 9/2013 | Kumai | H01L 31/0516 136/256 |
| 2015/0316955 | A1* | 11/2015 | Dodds | G06F 3/0412 345/173 |
| 2017/0358700 | A1* | 12/2017 | Kumai | H01L 31/0516 |
| 2018/0138116 | A1* | 5/2018 | Lin | H01L 25/0652 |

FOREIGN PATENT DOCUMENTS

| | | | |
|---|---|---|---|
| EP | 1030357 A1 * | 8/2000 | ............. H01L 24/11 |
| EP | 1030357 A1 | 8/2000 | |
| EP | 1143515 A2 | 10/2001 | |

* cited by examiner

CARRIER SUBSTRATE FOR STRESS SENSITIVE DEVICE AND METHOD OF MANUFACTURE

This patent application is a national phase filing under section 371 of PCT/EP2018/055661, filed Mar. 7, 2018, which claims the priority of German patent application 102017106055.3, filed Mar. 21, 2017, each of which is incorporated herein by reference in its entirety.

TECHNICAL FIELD

The invention refers to a carrier substrate and a method for manufacturing a carrier substrate.

BACKGROUND

When mounting a stress sensitive chip on a substrate having a different coefficient of expansion every temperature variation causes tension in the chip. A first tension already occurs at a chip after soldering the chip on a substrate and cooling down the chip to room temperature. Any further temperature cycle lead to different tensions which may stress the chip and especially the point of connection which may be a solder bump. A growing number of such temperature cycles may fatigue the connections and may lead to damage up to total destruction of the device. To minimize such thermal stress the expansion coefficients have to be matched. Matching may be possible but restricts the manufacturer to using materials which are not optimized with respect to the desired function as a chip material or a substrate material.

According to another known solution a dielectric polymer layer is applied over the contact surface of a chip device. The polymer layer functions as a planarization layer on top of which a redistribution layer is formed. On the redistribution layer solder bumps are formed. Due to the elastic properties of the polymer layer that is usually made from BCB, PI or PBO the stress can be reduced down to a certain amount.

However, some highly sensitive chips, for example, sensors that comprise movable parts or structures, are not useful for applying this technology. For such sensors, like microphones and pressure sensors that work with a membrane, any stress impacting the membrane has an impact on the sensor characteristic of the device. This impact does not lead to any damage, but on a very low stress level has the consequence that the characteristic parameters of the sensor vary with the stress. Hence, any measurement with such a stress-impacted sensor delivers values that may deviate from values measured with a non-impacted sensor.

Another consequence is that the measured values show a great distribution which is not acceptable for the sensor application. Moreover, commonly used solder materials have a moderate melting point of about 180° C. to 230° C. Such solder materials are in a high temperature regime already at room temperature when seen from a metallurgical view. This means that any mismatch dependent stress rapidly leads to plastic deformation of the solder connection. Such a deformation has a typical time constant of only a few days. After soldering such a chip onto a substrate or into a device and still after calibration of the sensor a substantial deviation of the sensor characteristic can occur. Further problems arise as the sensitive membrane cannot withstand some process steps used in this stress-reducing method. The very sensitive and movable structures and membranes of the sensor devices do not allow using the required deposition and structuring steps for the polymer layer according to the proposed process.

SUMMARY OF THE INVENTION

Embodiments provide a stress-reducing process and arrangement that allows mounting stress-sensitive chip devices like sensor chips onto a substrate with reduced total stress.

Embodiments provide a stress-releasing arrangement that has no restraints in view of any process-sensitive structures on a device. Hence, the stress-releasing means are arranged on the substrate on which the stress-sensitive device is mounted. The advantage is that all process steps that provide the stress-releasing means can be done at the substrate which itself is not stress-sensitive.

The inventive carrier substrate comprises a substrate body having a multilayer structure. On the upper side of the substrate body there are electrical connection pads. Further, an organic cushion layer is arranged on the upper side of the substrate body. On top of the cushion layer solder pads are arranged for mounting an electric device thereon. Electrically conductive elongated parts connect a connection pad on the upper side of the substrate body to a solder pad on top of the cushion layer. Due to the elongated part connection pads and according solder pads can be fabricated at a distance from one another such that a substantial amount of the elongated bar part is guided on top of the cushion layer. As a consequence, the elongated part requires a length in the direction of elongation that is at least the distance between the respective connection pad and the according solder pad. Preferably but not necessarily the direction of elongation complies with the axis along which the elongated part has its greatest extension. Hence, the shape of the elongated part may be arbitrarily chosen.

The cushion layer itself has some elastic properties that are due to the low E-modulus of the organic cushion layer. Therefore, the cushion layer can function as a stress release layer that compensates part of the stress that may be built up between the connection pad and the solder pad. Further, the stress-relaxing effect is effective at any temperature variation the device is exposed to.

According to an embodiment the elongated parts on the upper side of the cushion layer are bent or angled along their course to provide a length along their course that is greater than the shortest distance between the respective solder pad and the connection pad. Such a bent or angled elongated part can compensate decreasing or increasing geometrical dimensions even if different thermal expansion of connected parts takes place.

The cushion layer needs a low E-modulus of about 1 GPa or less. This means that already small forces impacting on the cushion layer result in a deformation that is a compensation of the forces by the cushion layer. A still lower E-modulus of about 0.1 GPa (measured at 25° C.) or less is preferred.

A further parameter that is important for the compensating function of the cushion layer is the layer thickness of the cushion layer which is preferably chosen to be to μm or more. A preferred range is from 20 to 50 μm layer thickness of the cushion layer. The relatively high thickness of the cushion layer provides a high enough deformation reserve if respective forces impact on the cushion layer.

The conductive elongated part is structured from a metal layer deposited on top of the cushion layer. The structuring of the metal layer may use a process that structures the metal layer and the cushion layer underneath such that elongated part and cushion layer have a common structural edge. The structuring may be done by forming incisions along the desired structural edges of the elongated parts thereby removing at least part of the cushion layer. In these incisions, the cushion layer may be removed at least partly but most preferably it is removed totally along the incision lines down to the surface of the substrate body. By the incisions the elongated part is electrically isolated from the remaining metal layer that has originally been applied over the entire surface of the cushion layer. In some cases, it is hence not necessary to remove these remaining parts of the metal layer. But it is possible to remove the metal layer such that only the elongated parts remain after structuring.

When removing the remaining metal layer the underlying cushion layer may be removed at the same time. Removing can be done by simply tearing off the metal layer together with the underlying cushion layer like a film from the surface of the substrate body.

After structuring metal layer and cushion layer together and removing remaining metal layer and remaining cushion layer the structured cushion layer forms a kind of a mesa structure. The surface of this mesa structure is totally covered by the elongated parts.

If the remaining parts of the metal layer and the underlying cushion layer that do not form the elongated parts remain on the substrate body they can be used as supporting structures without any further electrical function and just for enhancing the mechanical stability of a later arrangement when an electrical device is mounted on the surface of the carrier substrate. In this case only the elongated parts have electrical contact to the connection pads on the surface of the substrate body whereas the substrate body does not have any further electrical contact on its upper surface.

The carrier substrate can preferably be used for mounting a stress-sensitive electrical device thereon, like a MEMS microphone. The MEMS microphone can be bonded in a flip-chip arrangement on the solder pads on the upper surface of the cushion layer.

BRIEF DESCRIPTION OF THE DRAWINGS

In the following the invention will be explained in more detail with respect to representative embodiments and the accompanying figures. The figures are schematic only and are not drawn to scale. No absolute or relative dimensions can be taken from the figures as some parts may depicted enlarged for better understanding.

DETAILED DESCRIPTION OF ILLUSTRATIVE EMBODIMENTS

FIG. 1 to 8 show different process steps of a method of forming a carrier substrate. At the top side of each figure a top view onto the substrate is depicted. A cross section through the same substrate is shown at the bottom side of the figure as well. Both partial figures highlight the same process stage.

Figure 1:
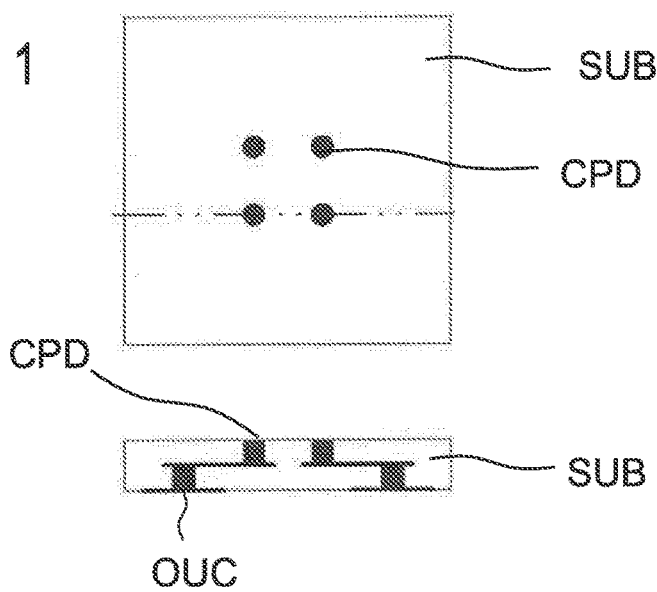
FIG. 1 shows a substrate body in a top view and in a cross-sectional view.

FIG. 1 shows a simplified substrate body SUB of a carrier substrate in a top view and in a cross-sectional view along the dotted line shown in the upper part of the figure. The substrate body SUB may be multilayered, for example, an organic laminate or a ceramic multilayer substrate. Especially preferred are ceramic multilayers of the type HTCC (high temperature co-fired ceramic). Within the substrate body SUB a wiring structure may be present allowing placing or replacing electrical contacts on or at a desired location on top of the substrate body SUB. One or more such wiring layers are arranged inside the substrate body and connected to a respective contact pad CPD on a surface of the substrate body SUB by a through contact. The figure shows a substrate body with four connection pads CPD which may be represented by the top ends of the upper through contacts or which may be structured from a metal layer applied above the top through contacts ending on the top surface of the substrate body SUB.

Independent from the question of whether there are formed additional contact areas or whether the contact is provided only by the top surface of the through contacts, these contacts are referred to as contact pads CPD.

On the bottom surface of the substrate body SUB outer contacts OUC may be arranged for connecting the substrate body with an external circuitry. These outer contacts OUC may also be connected to the wiring layer by through contacts.

In a first step a cushion layer CUL is applied on top of the surface of the substrate body to cover the entire surface thereof. A preferred cushion layer is made of a polymer foil of a thickness of about 20 μm. Such a foil is preferably in a B-state which means that the polymer is not totally cross-linked and may be hardened to the final stage in a later step.

In the B-stage, polymer foils may be softened by heat or a solvent. Hence, such softened foils can be laminated on and show good adhesive properties. The adhesive property is an intrinsic property of the B-stage foil which can be enhanced by applying an additional adhesive layer between cushion layer CUL and substrate body SUB.

Figure 2:
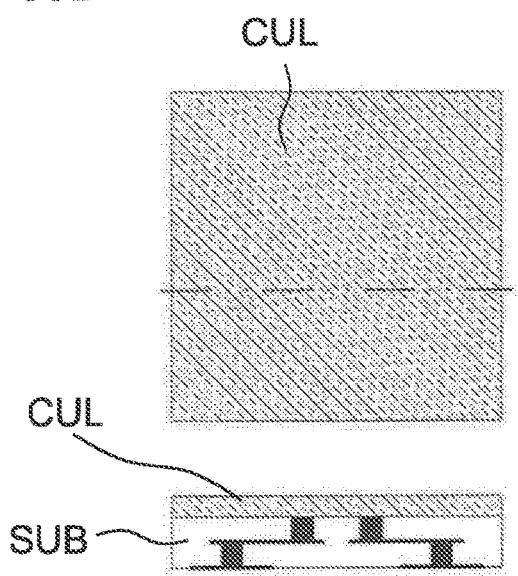
FIG. 2 shows two views onto the same substrate body after applying a cushion layer.

The polymer foil can be applied by hot pressing, roll laminating or within an autoclave. In some cases, an adhesion enhancer can be applied on top of the substrate body before applying the polymer foil as a cushion layer. FIG. 2 shows the arrangement after this step.

Figure 3:
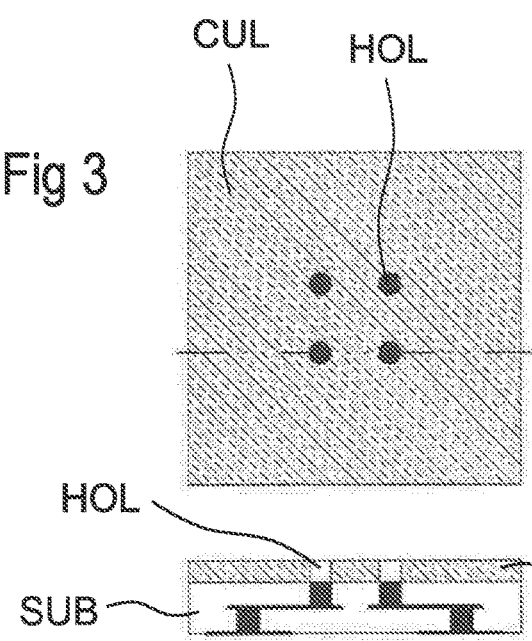
FIG. 3 shows the arrangement after drilling holes to expose connection pads.

In the next step, openings HOL are formed in the cushion layer CUL to expose therein the contact pads CPD on top of the substrate body SUB. These openings HOL may be formed by laser drilling or by a photolithography using a solvent or an etching method. The metallic connection pad CPD provides a good stop for the structuring step by etching or drilling. It is important that the cushion layer CUL is completely removed in the openings HOL to expose the connection pad CPD at least partially. The connection pad may have a diameter that is greater, smaller or complies with the diameter of the openings HOL FIG. 3 shows the arrangement after this step.

In the next step a metallic layer MET is applied on the entire top surface of the cushion layer CUL. The metal layer MET is applied such that it contacts the connection pads CPD within the openings HOL. The metallic layer MET is applied as a continuous layer totally covering the top of the arrangement including sidewalls of the opening.

The metal layer MET may be deposited in a wet chemical step by current-less metal deposition. Good adhesion of the metal layer MET can be provided if using a CVD or PVD process (chemical vapor deposition/physical vapor deposition). In a preferred method, at least a part layer of the metal layer is applied by sputtering. The metal layer MET can be applied as a uniform layer or as a layer comprising two or more partial layers. Thus, it is possible to first apply a thin partial layer with a CVD or PVD process and to enforce the layer thickness by wet chemical deposition. Hence, the metal layer can comprise different partial layers made of different materials.

In an embodiment a titanium-containing adhesion layer of a thickness of 50 nm can be applied as a first partial layer. A second partial layer made of a sputtered copper film in a thickness of about 1 μm may follow. It is possible to reinforce this sputtered copper layer by a galvanic deposition of a metal like copper in a thickness of about 10 μm thereby completing the deposition step of the metal layer MET. Alternatively, it is also possible to sputter a thick layer of sufficient thickness instead of galvanic deposition. According to a further variant a metal layer may be deposited in a catalytic current-less deposition method as known from printed board production technology.

Figure 4:
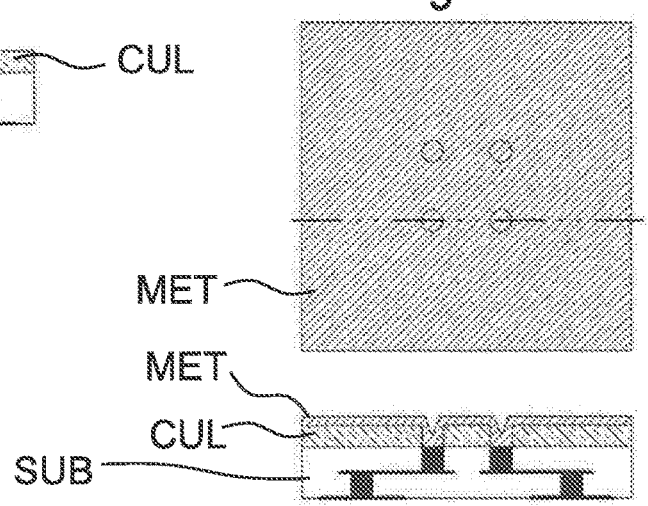
FIG. 4 shows the arrangement after depositing a metal layer on top of the cushion layer.

As an intermediate step before applying the metal layer the surface of the cushion layer and the exposed connection pads CPD may be cleaned in a mechanical, chemical or plasma process. When using a vapor deposition method for depositing the metal layer, a cleaning with a plasma process or by sputter etch are advantageous. FIG. 4 shows the arrangement after applying the metal layer MET. From the lower part of the figure it becomes clear that the metal layer contacts the connection pads within the holes HOL.

In the next step the metal layer MET is structured to define the elongated parts ELP. At a structuring line that forms a closed loop surrounding the elongated parts ELP incisions INC are made through the metal layer MET. Preferably a laser cutting is used to form incisions INC through the metal layer along the structural edge of the elongated parts. Thereby the elongated parts are electrically isolated from the remaining area of the metal layer MET.

Figure 5:
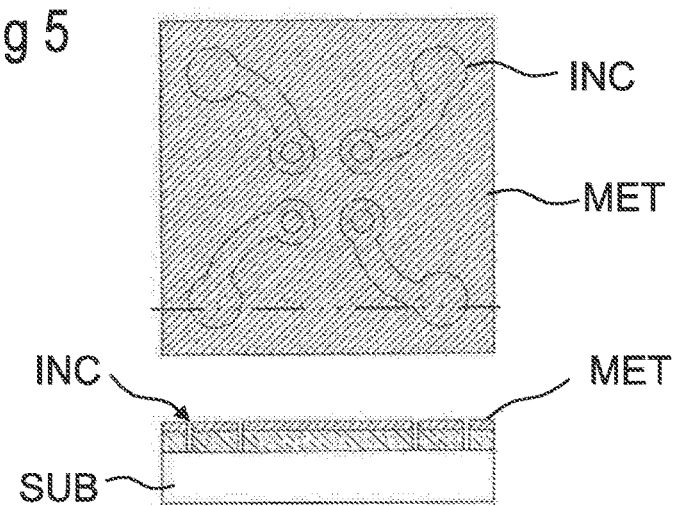
FIG. 5 shows the arrangement after making incisions for structuring elongated parts within the cushion layer and the metal layer.

UV lasers with a wavelength of, for example, 365 nm are preferred for forming the incisions INC. The laser can be focused to a cutting width of about to μm or more. A broader incision INC can be preferred to reduce parasitic capacitances between the elongated parts and the remaining metal layer MET. FIG. 5 shows the arrangement after forming the incisions.

In a next step, that is an optional step, the remaining part of the metal layer MET can be removed. This can be done by mechanically tearing away the metal layer from the substrate body SUB. The tearing off can be made easier if the parameters during laminating on the cushion layer CUL are chosen such that the adhesion is not at its final strength and removing of the cushion layer from the substrate body SUB is possible.

Figure 6:
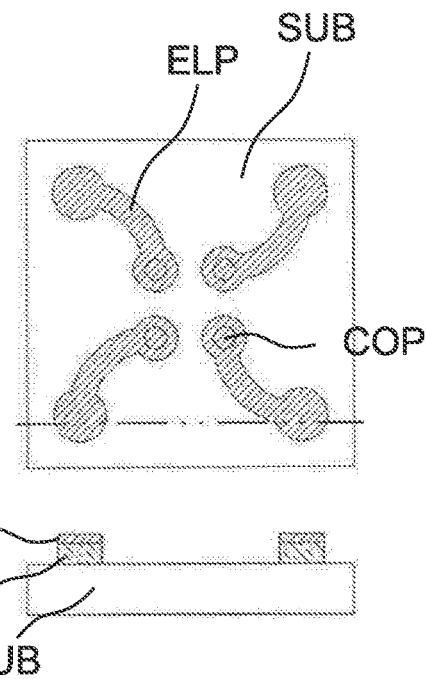
FIG. 6 shows the arrangement after removing remaining metal layer and cushion layer.

To keep the adhesion low it is further necessary to avoid a too high temperature while depositing the metal layer MET. Otherwise the cushion layer CUL leaves the B-stage and hardens towards a final adhesion strength. FIG. 6 shows the arrangement after the step of removing the remaining area of the metal layer MET. The elongated parts ELP stand as the remaining portion of the metal layer and extend over a respective structured portion of the cushion layer CUL. In the area of the former holes HOL the elongated parts ELP are in direct contact with the connection pads COP.

In the next step solder pads SOP are defined on the end of the elongated part ELP that is most distant from the connection pad CLP. A solder mask SOM is applied in a structured form to allow the end of the elongated part ELP that forms the solder pad SOP to be exposed. The solder mask SOM defines the area where the later solder bump or solder ball is wetting and contacting the metal of the elongated part ELP to avoid excessive spread of the molten solder.

Figure 7:
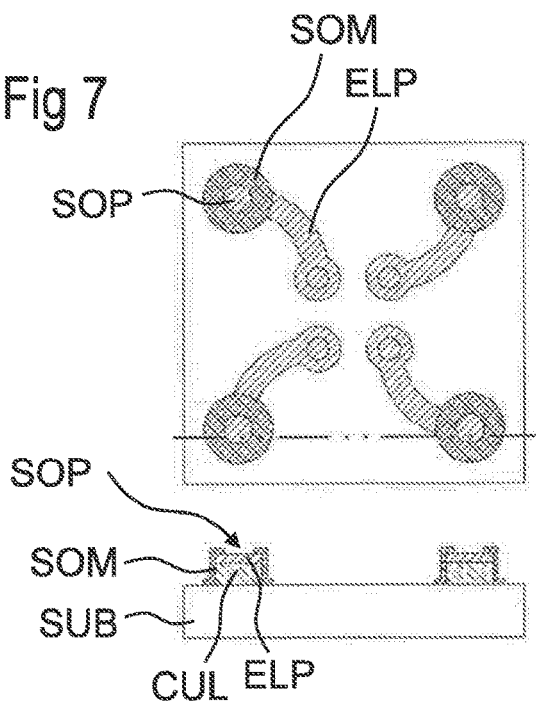
FIG. 7 shows the arrangement after applying a solder mask.

The solder mask can be applied by conventional methods such as silk screening. Alternatively, a lithographical structuring of an applied resin layer or a resin foil is possible. For forming only a lower number of solder pads a series printing method, like jet printing, may be preferred. FIG. 7 shows the arrangement after forming the solder mask SOM.

From the cross-sectional view in the lower part of the figure it can be seen that the solder mask SOM covers the edges of the mesa structure formed by the cushion layer CUL and the metallization of the elongated part. In other cases where the optional step of removing the remaining area of the metal layer MET is omitted and the solder mask SOM is applied directly onto an arrangement as shown in FIG. 5, the solder mask SOM may then extend over some area of the remaining metal layer MET. Hence, the solder mask SOM needs not necessarily cover the sidewalls of the cushion layer CUL and the metal layer MET In the next step, solder balls SOB are produced on the solder pads SOP. Well known processes can be used to form the solder balls SOB. A preferred method is printing of a solder paste on top of the solder pad SOP followed by a melting of the solder paste such that a solder ball SOB forms. Alternatively, a single ball bumping may be used. In this method, pre-fabricated solder balls SOB are deposited selectively and mounted on the solder pads SOP.

When using a printing method like silk printing or stencil printing it may be preferred to apply the solder mask SOM directly after forming the incisions as shown in FIG. 5. In this case, the surface onto which the printing is done is more plane and makes the printing process easier as only small height differences need to be covered. Then, the remaining metal layer may be removed or not. It is even possible to apply the solder mask before forming the incisions. In that case, the incisions will define the outer shapes of solder mask, metal and cushion pattern in one step.

Contrary to applying the solder balls SOB onto the carrier substrate it is also possible to form the solder balls SOB at the respective connection sides of an electric or electronic device that has to be mounted onto the carrier substrate.

Dependent on the material system of solder pad SOP and solder material used, it can be useful to apply further metal layers at least directly under the solder ball to form a respective under bump metallization UBM. Such a UBM can prevent oxidation of the solder pad SOP and enhances wetting of the solder pad SOP by the solder and can function as a diffusion barrier. Preferred materials for forming the UBM can be selected from gold, palladium, copper, nickel or nickel/vanadium. Besides these exemplary named materials other useful materials can be used.

Figure 8:
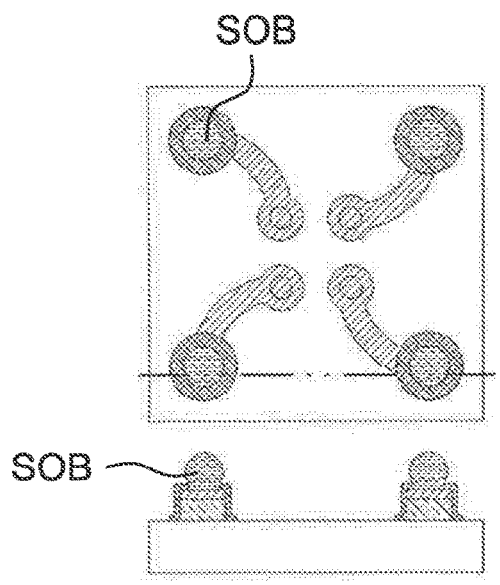
FIG. 8 shows the arrangement with solder balls arranged on solder pads.

FIG. 8 shows the arrangement after forming the solder balls SOB on top of the solder pads SOP. The carrier substrate is now ready for mounting an electric device thereon.

Figure 9:
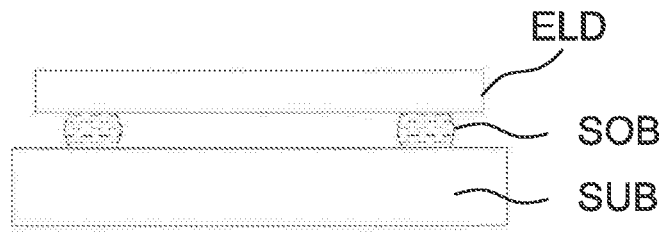
FIG. 9 shows a cross-sectional view of an electric device mounted in flip-chip onto a substrate body.

FIG. 9 shows an electric device ELD that is bumped onto the surface of a carrier substrate SUB according to prior art in a schematic drawing. Electric device ELD and substrate body SUB of the carrier substrate are connected rigidly by the solder bump SOB that is formed from solder. If substrate body SUB and electric device ELD, that is for example a chip, have different coefficients of thermal expansion any temperature change produces a mechanical stress in the connection and in the chip. This may change a sensor characteristic if the electric device is a sensor.

Figure 10:
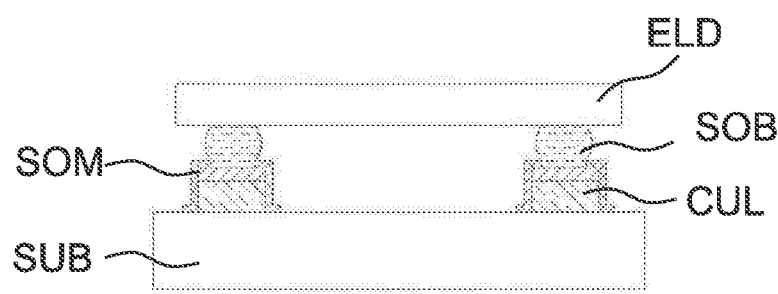
FIG. 10 shows a cross-sectional view of an electronic device mounted on a solder pad above an inventive cushion layer on a carrier substrate.

FIG. 10 shows a cross-sectional view of an electronic device ELD that is mounted on top of a carrier substrate. Any stress due to different expansion between substrate body SUB and chip of electronic device ELD is compensated and released by the cushion layer CUL that is arranged between the solder bump connection on the solder pad SOP and the substrate body SUB. This figure shows the embodiment where the remaining metal layer and the remaining cushion layer are removed.

Figure 11:
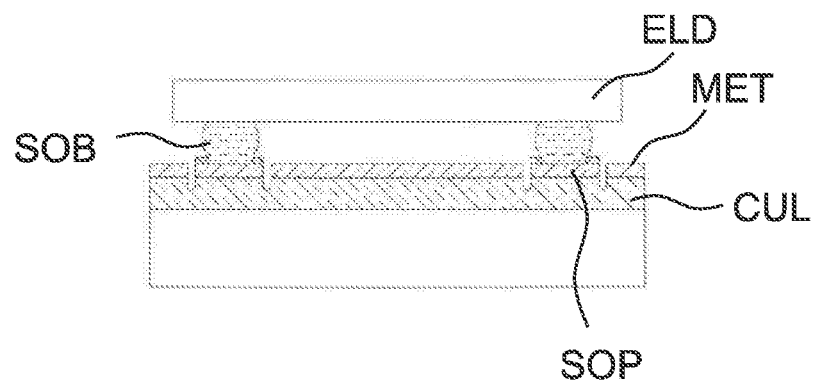
FIG. 11 shows another embodiment with unremoved remaining parts of cushion layer and metal.

In contrast thereto FIG. 11 shows an embodiment where the remaining metal layer MET is isolated only by incisions from the elongated parts ELP and can remain also after mounting the electric device ELD.

Figure 12:
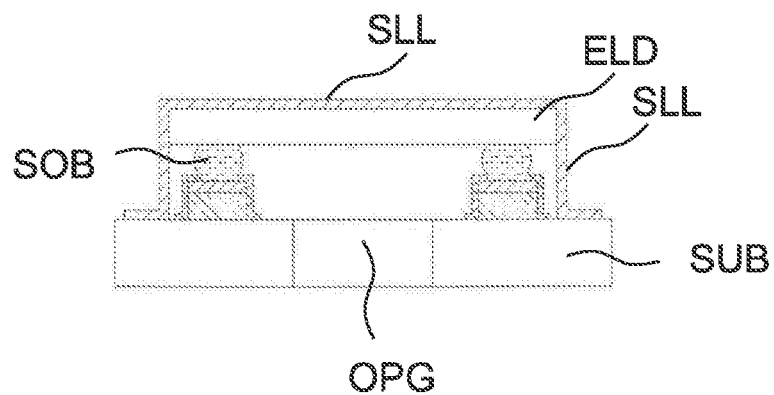
FIG. 12 shows a ready-to-use electronic device embodied as a sensor device.

FIG. 12 shows the arrangement of Figure to after applying a sealing layer SLL over the electric device ELD and the encircling surface of the substrate body SUB. The sealing layer SLL may be a laminated foil, may have a multilayer structure or can simply be formed by a rigid cap mounted on top of the substrate body to enclose there under the electric device ELD. A sound opening OPG is guided through the substrate body SUB into the cavity enclosed under the sealing layer SLL. The sound opening OPG may be useful if the electric device ELD is a pressure sensor or a microphone. Preferably, the electric device ELD is a MEMS microphone.

The invention has been explained with reference to a limited number of exemplary embodiments and accompanying figures. However, the invention is not limited by the exemplary shown embodiments and can comprise a lot of variations without leaving the scope of the invention. For example, the cushion layer CUL may be produced from a material different than explained above in a step different from the explained step. For example, a resin layer may be applied to the entire surface and may be structured in additive or subtractive procedure. The cushion layer may alternatively be deposited in a printing process and can comprise a silicone rubber. The mesa structures of the cushion layer carrying the elongated parts may have sidewalls that are vertical or that include an angle with the surface of the substrate body SUB that deviates from 90°. The flanks or sidewalls may also be formed in a slightly rounded shape. A non-vertical sidewall of the mesa structure has the advantage that a surface covering of the sidewall during deposition of the metal layer MET is supported and made easier.

Further, it is possible to structure the metal layer MET in a photolithographic method and to form the incisions INC by etching.

The idea of forming an elongated part ELP on top of a cushion layer CUL on a carrier substrate can be also used to form a planar conductor line to produce a kind of wiring that needs not connect a connection pad on the surface of the substrate body and a solder pad. Hence, any kind of wiring necessary can be done by elongated parts produced on a cushion layer.

In another embodiment, the cushion layer can be used to support an electric device in a mechanical way only without providing an electrical connection. Such mechanical supporting structures may further reduce the stress that may remain after mounting an electric device to the carrier substrate.

According to another embodiment, the carrier substrate is scanned and measured, and the measured values are stored numerically to control all process steps that are carried out in a structured way with respect to the height of the structure or the area of the structure. Such a numerically controlled method is preferred when using a ceramic carrier substrate made of an HTCC material.

We claim:

1. A carrier substrate comprising:
a substrate body having a multilayer structure;
electrical connection pads on a top surface of the substrate body;
an organic cushion layer on the top surface of the substrate body;
electrically conductive elongated parts arranged on top of the cushion layer, wherein each conductive elongated part is contacted to a respective electric connection pad;
a solder pad located at an end of each elongated part distant from the respective connection pad,
wherein the cushion layer and the conductive elongated parts are commonly structured to provide a common structural edge; and
a remaining metal layer different and separate from the elongated conductive parts,
wherein the remaining metal layer forms supporting structures that have no electrical connection to a connection pad on top of the substrate body.

2. The carrier substrate of claim 1, wherein the elongated parts guided on top of the cushion layer are bent or angled such that the elongated parts have a length measured along their course that is larger than a shortest distance between the respective solder pad and the respective connection pad connected by an elongated part.

3. The carrier substrate of claim 1, wherein the organic cushion layer is a polymer having an E-modulus of 1 GPa or less.

4. The carrier substrate of claim 1, wherein the cushion layer has a thickness of 10 µm to 50 µm inclusive.

5. The carrier substrate of claim 1,
wherein the cushion layer is structured to form mesa structures,
wherein a top surface of the mesa structures are entirely covered by a metal layer, and
wherein the conductive elongated parts are formed in or from the metal layer.

6. The carrier substrate of claim 1, wherein the elongated parts are structured from a large area metal layer, and wherein incisions that are cut into the metal layer are separating and isolating the elongated parts from the remaining metal layer.

7. A MEMS microphone bonded onto the solder pads of the carrier substrate of claim 1.

8. A method for manufacturing a carrier substrate, the method comprising:
providing a substrate body having a multilayer structure and an integrated wiring structure connected to electrical connection pads on a top surface of the substrate body;

applying a cushion layer to the entire top surface of the substrate body;

keeping an organic material of the cushion layer in a non-hardened B-stage;

structuring the cushion layer by forming recesses or holes with in the cushion layer to expose the connection pads on the surface of the substrate body;

applying a metal layer onto an entire top surface of the cushion layer to completely cover the top surface of the cushion layer such that the metal layer contacts the exposed connection pads in the recesses or holes on the top surface of the substrate body;

structuring the metal layer by forming incisions in the metal layer along edges of electrically conductive elongated parts to form the electrically conductive elongated parts, wherein the elongated parts and a remaining metal layer are electrically isolated from each other by the incisions and the remaining metal layer has no electrical connection to a connection pad on top of the substrate body; and forming a solder pad at a respective end of an elongated part that is distant from the connection pad so that each elongated part connects a connection pad and a solder pad, wherein the remaining metal layer is not removed in the method for manufacturing carrier substrate and remains as supporting structures on top of the substrate body.

9. The method of claim 8, wherein structuring of the cushion layer comprises a photolithography process or a laser drilling.

10. The method of claim 8,
wherein applying the cushion layer comprises applying a laminated foil or a resin layer in a layer thickness of about 10 to 50 μm, and
wherein the organic material has an E-modulus of 1 GPa or less such as 0.1 GPa or less.

11. The method of claim 8, further comprising forming solder balls on top of the solder pads.

12. A carrier substrate comprising:
a substrate body having a multilayer structure;
electrical connection pads on a top surface of the substrate body;
a structured organic cushion layer on the top surface of the substrate body;
electrically conductive elongated parts arranged on top of the cushion layer, wherein each conducive elongated part contacts an electric connection pad; and
solder pads located at ends of the elongated parts distant from the connection pads,
wherein the elongated parts are defined and structured by incisions cut in a large area metal layer located on top of the structured cushion layer, and wherein the incisions are separating and isolating the elongated parts from a remaining metal layer, the metal layer having no electrical connection to a connection pad on top of the substrate body.

13. A carrier substrate comprising:
a substrate body having a multilayer structure;
electrical connection pads on a top surface of the substrate body;
an organic cushion layer on the top surface of the substrate body;
electrically conductive elongated parts arranged on top of the cushion layer, wherein each conductive elongated part is contacted to a respective electric connection pad, wherein the elongated parts are structured from a large area metal layer, and wherein incisions that are cut into the metal layer are separating and isolating the elongated parts from a remaining metal layer;
a solder pad located at an end of each elongated part distant from the respective connection pad; and
the remaining metal layer that is different and separate from the elongated conductive parts, wherein, when an electrical device is mounted on the carrier substrate, the remaining metal layer forms supporting structures that have no electrical connection to a connection pad on top of the substrate body.

14. A method for manufacturing a carrier substrate, the method comprising:
providing a substrate body having a multilayer structure and an integrated wiring structure connected to electrical connection pads on a top surface of the substrate body;
applying a structured cushion layer on the top surface of the substrate body or applying a cushion layer to an entire surface and structuring the cushion layer to expose the connection pads on the surface of the substrate body;
applying a metal layer on top of the cushion layer to completely cover a top surface of the cushion layer and thereby contacting the exposed connection pads on the top surface of the substrate body;
structuring the metal layer by forming incisions in the metal layer to form electrically conductive elongated parts;
forming a solder pad at a respective end of an elongated part that is distant from the connection pad so that each elongated part connects a connection pad and a solder pad;
removing the metal layer together with a respective part of the cushion layer that is lying directly below at an area outside of an area surrounded by the incisions and defining the elongated parts; and
completely hardening the cushion layer in a hardening process after removing the part of the cushion layer.

* * * * *